(12) United States Patent
Abe

(10) Patent No.: US 8,337,616 B2
(45) Date of Patent: Dec. 25, 2012

(54) APPARATUS AND METHOD FOR PRODUCING SINGLE CRYSTAL

(75) Inventor: Takao Abe, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/734,423

(22) PCT Filed: Dec. 1, 2008

(86) PCT No.: PCT/JP2008/003542
§ 371 (c)(1),
(2), (4) Date: Apr. 30, 2010

(87) PCT Pub. No.: WO2009/081523
PCT Pub. Date: Jul. 2, 2009

(65) Prior Publication Data
US 2010/0229785 A1 Sep. 16, 2010

(30) Foreign Application Priority Data
Dec. 25, 2007 (JP) .................. 2007-332457

(51) Int. Cl.
*C30B 35/00* (2006.01)
*C30B 15/00* (2006.01)
(52) U.S. Cl. ............. 117/34; 117/11; 117/13; 117/200; 117/206; 117/217; 117/218; 117/222
(58) Field of Classification Search ............. 117/11, 117/13, 34, 200, 206, 217, 218, 222
See application file for complete search history.

(56) References Cited

U.S. PATENT DOCUMENTS

| 5,009,865 | A | * | 4/1991 | Boden et al. | 117/202 |
| 5,248,378 | A | * | 9/1993 | Oda et al. | 117/217 |
| 5,916,364 | A | * | 6/1999 | Izumi | 117/13 |
| 5,942,032 | A | * | 8/1999 | Kim et al. | 117/13 |
| 2004/0226504 | A1 | * | 11/2004 | Nakashima et al. | 117/13 |

(Continued)

FOREIGN PATENT DOCUMENTS
JP    A-63-319293    12/1988
(Continued)

OTHER PUBLICATIONS
Derwent Abstract of KR 1991-0009968 (1991).*
(Continued)

*Primary Examiner* — Matthew Song
(74) *Attorney, Agent, or Firm* — Oliff & Berridge, PLC

(57) ABSTRACT

A single-crystal manufacturing apparatus comprises a chamber, a crucible in the chamber, a heater arranged around the crucible, a lifting mechanism for lifting a seed crystal, and a guide passage for the seed crystal and a grown single crystal. In the single-crystal manufacturing apparatus, a material polycrystal contained the crucible is melted by a heater, and the seed crystal is made to contact the molten polycrystal and is lifted. The single-crystal manufacturing apparatus comprises a cylindrical quartz tube having a curved bottom portion, and a dome-shaped quartz plate. The curved bottom portion faces the crucible from the upper portion of the chamber through the guide passage. The quartz plate is arranged to enclose the quartz tube. The quartz tube has a reflecting structure for reflecting a heat ray from at least its bottom portion whereas the quartz plate has a reflecting structure for reflecting the heat ray to the crucible.

22 Claims, 4 Drawing Sheets

U.S. PATENT DOCUMENTS

2008/0035050 A1 * 2/2008 Sakurada ................ 117/13

FOREIGN PATENT DOCUMENTS

| JP | U-64-026377 | 2/1989 |
| JP | A-10-081595 | 3/1998 |
| JP | A-10-158091 | 6/1998 |
| JP | A-2001-213691 | 8/2001 |
| JP | A-2002-226299 | 8/2002 |
| KR | 19910009968 A * | 6/1991 |
| WO | WO 2006040878 A1 * | 4/2006 |

OTHER PUBLICATIONS

Korean Intellectual Property Office, English Translation of KR 1991-0009968 (1991).*

International Search Report issued in International Application No. PCT/JP2008/003542 on Jan. 27, 2009 (with English-language translation).

* cited by examiner

APPARATUS AND METHOD FOR PRODUCING SINGLE CRYSTAL

TECHNICAL FIELD

The present invention relates to an apparatus and a method for producing various crystal materials, such as semiconductors, dielectrics and magnets by the Czochralski method (hereinafter, referred to as the CZ method).

BACKGROUND ART

An apparatus for producing a single crystal is used to produce single crystals such as semiconductors, dielectrics and magnets according to the CZ method. The apparatus comprises a crucible, a heater and the like that are accommodated in a chamber, the crucible which is driven to rotate about its center, the heater which is arranged around the crucible, heats a polycrystalline raw material that is introduced into the crucible by the heater to obtain a polycrystalline melt, immerses a seed crystal that is attached at a lower end of a superior axis such as a wire into the polycrystalline melt, and grows a predetermined single crystal below the seed crystal by pulling the seed crystal upward at a predetermined speed with rotating the superior axis.

FIG. 4 shows an example of a schematic sectional view of a conventional apparatus for producing a single crystal 13 according to the CZ method. In FIG. 4, 1 shows the crucible that accommodates the polycrystalline raw material 2 and a cylindrical heater 3 made of graphite etc. is arranged in the outer periphery of the crucible. As needed, a bottom portion heat insulating material 4 is arranged below the crucible 1, and a cylindrical heat-insulating material 5 is arranged outside the heater 3. These are accommodated in a lower chamber 6 or an upper chamber 7.

Moreover, a leading passage 8 for pulling the single crystal is provided in the upper chamber 7.

In the case of producing the single crystal by using the foregoing conventional apparatus for producing a single crystal 13, the polycrystalline raw material 2 is melted with a resistance heating heater 3 that is made of graphite etc. and that is arranged around the crucible 1. However, there is a problem such that melting time becomes longer in proportion to an increase in a charging amount (a melting amount) with a larger diameter of crystal in recent years.

In addition, heat generated with the heater 3 is dissipated upward through the upper chamber 7 or the leading passage 8 for the single crystal, at the same time, heat is also dissipated from a surface of the melted raw material and the crucible through the upper chamber 7 or the leading passage 8, and these make time required for melting longer.

For example, in the apparatus for producing a silicon single crystal having a large diameter, melting the polycrystalline raw material needs an electric power of 200 to 300 kW/h and almost all its heat quantity are discharged from a water-cooled chamber wall to the outside. The apparatus therefore needs to maintain an appropriate temperature and suppress the heat quantity consumed into a surface of the wall in a hot zone.

In view of this, there is disclosed an apparatus for producing a single crystal that enables the melting time of the polycrystalline raw material to be shortened by comprising an auxiliary heating device with a lamp or a laser separately from the heater arranged around the crucible (for example, see Japanese Patent Laid-open (Kokai) No. H10-81595).

In addition to that, in order to prevent heat from emitting to an upper portion of the chamber, there are disclosed an apparatus for producing a single crystal in which a heat shielding plate is arranged above the crucible at the time of melting the polycrystalline raw material (see Japanese Patent Laid-open (Kokai) No. H10-158091), and in which a discoid reflecting material, which is made of a high melting point material such as Mo, W or Si, is arranged at the time of melting the polycrystalline raw material (see Japanese Patent Laid-open (Kokai) No. 2001-213691).

DISCLOSURE OF INVENTION

As described above, there is a problem such that since the melting amount of the polycrystalline raw material increases with a larger diameter of a semiconductor single crystal in recent years, the time required for melting becomes longer in proportion to the melting amount, electric power consumption consequently increases and loss of producing time of the crystal also increases.

In view of the above-explained problems, it is an object of the present invention to provide an apparatus and a method for producing a single crystal that enable production cost and electric power cost to be reduced by shortening the melting time and hence by shortening cycle time.

To achieve this object, the present invention provides an apparatus for producing a single crystal having at least: a chamber; a crucible in the chamber; a heater arranged around the crucible; a pulling mechanism for pulling a seed crystal; and a leading passage for the seed crystal and the single crystal to be grown; and producing the single crystal by melting a polycrystalline raw material contained in the crucible by the heater, bringing the seed crystal into contact with the polycrystalline melt and pulling the seed crystal, wherein the apparatus including a cylindrical quartz pipe having a curved-surface-shaped bottom portion and a dome-shaped quartz plate, the quartz pipe is arranged from an upper portion of the chamber through the leading passage so that the curved-surface-shaped bottom portion faces an upper portion of the crucible, and the quartz plate is arranged so as to surround the quartz pipe, the quartz pipe has a reflecting structure where at least the bottom portion reflects heat rays, and the quartz plate has a reflecting structure where heat rays are reflected toward the crucible.

In this manner, the present invention is composed such that the cylindrical quartz pipe is arranged so as to face the upper portion of the crucible, the quartz pipe which has the reflecting structure where the curved-surface-shaped bottom portion reflects heat rays toward the crucible, and the dome-shaped quartz plate is arranged so as to surround the quartz pipe, the quartz plate which has the reflecting structure where heat rays are reflected toward the crucible, at the time of melting the polycrystalline raw material.

According to this structure, heat rays dissipated toward the leading passage from the heater and the crucible can be condensed to reflect toward the polycrystalline raw material by the cylindrical quartz pipe, heat rays dissipated toward the chamber can be condensed to reflect toward the polycrystalline raw material by the quartz plate, and thereby heat that is conventionally thrown away can be used usefully. Melting can be therefore advanced by increasing total heat quantity applied to the polycrystalline raw material in comparison with a conventional apparatus, and the time required for melting can be shortened. Consequently, the time required for producing the single crystal can be shortened, and improvement in productivity and reduction in production cost can be therefore achieved.

Moreover, any of gold plating, gold evaporation and gold coating are preferably performed as the reflecting structure of the quartz pipe and the quartz plate.

In this manner, when any of plating, evaporation and coating of gold, which has a good reflection rate of heat rays, are performed as the reflecting structure of the quartz pipe and the quartz plate, reflection efficiency of the heat rays from the heater can be enhanced and the melting time of the polycrystalline raw material can be further shortened.

Moreover, when any of the gold plating, the gold evaporation and the gold coating are performed as the reflecting structure of the quartz plate, the quartz plate preferably has a sandwich structure where the gold plating, the gold evaporation and the gold coating are covered with quartz.

In this manner, when the quartz plate has the sandwich structure where the gold plating, the gold evaporation and the gold coating are covered with quartz, a gold thin film can be prevented from being peeled and incorporation of impurities can be prevented during melting the polycrystalline raw material and producing the single crystal. In addition, the gold thin film can be prevented from being peeled during cleaning the quartz plate.

Moreover, it is preferable that the quartz pipe has a halogen lamp inside, and the halogen lamp is arranged so as to form a condensing and reflecting structure for heating the polycrystalline raw material.

In this manner, when the halogen lamp is arranged inside the quartz pipe as an auxiliary to the heater so as to form the condensing and reflecting structure for heating the polycrystalline raw material, the heat quantity applied to the polycrystalline raw material can be increased and thereby the time required for melting can be further shortened.

Moreover, the quartz pipe can have a lens as the condensing and reflecting structure of the halogen lamp.

In this manner, when the lens is provided, the quartz pipe can easily bring the polycrystalline raw material into focus of the heat rays emitted from the halogen lamp and thereby melting the polycrystalline raw material can be more advanced.

Moreover, the quartz pipe and/or the quartz plate can have a water-cooled mechanism and/or an air-cooled mechanism for removing heat.

In this manner, when the cooling mechanisms of the quartz pipe and the quartz plate are provided, heat resistance of the quartz pipe and the quartz plate can be improved, thereby it can be used for a long time and cost of the quartz pipe and the quartz plate can be reduced.

Moreover, the quartz pipe may be movable up and down.

When the quartz pipe is movable up and down, the quartz pipe can easily bring the polycrystalline raw material into focus of the heat rays to be reflected by the reflecting structure of the quartz pipe.

Furthermore, the present invention provides a method for producing a single crystal according to the Czochralski method comprising melting a polycrystalline raw material contained in a crucible by heating with a heater, and growing the single crystal by pulling a seed crystal after bringing the seed crystal into contact with the melt, wherein at the time of melting the polycrystalline raw material by heating, arranging a cylindrical quartz pipe from an upper portion of a chamber through a leading passage so that a bottom portion of the quartz pipe faces an upper portion of the crucible, the cylindrical quartz pipe having a reflecting structure where at least the bottom portion reflects heat rays and having a curved-surface-shaped bottom portion, and arranging a dome-shaped quartz plate so as to surround the quartz pipe, the dome-shaped quartz plate having a reflecting structure where heat rays are reflected toward the crucible, heating and melting the polycrystalline raw material, taking out the quartz pipe outside the chamber after melting, and bringing the seed crystal into contact with the polycrystalline raw material melt subsequently and pulling the single crystal to produce the single crystal.

In this manner, the cylindrical quartz pipe, which has the reflecting structure where heat rays is reflected toward the crucible and has the curved-surface-shaped bottom portion, is arranged through the leading passage so that the bottom portion faces the upper portion of the crucible, the dome-shaped quartz plate, which has the reflecting structure where heat rays are reflected toward the crucible, is arranged around the quartz pipe, the polycrystalline raw material is melted, and then the single crystal is produced after taking out the quartz pipe arranged in the leading passage outside the chamber.

According to this method, heat rays dissipated toward the leading passage from the heater and the crucible can be condensed to reflect toward the polycrystalline raw material by the quartz pipe, heat rays dissipated toward the chamber can be condensed to reflect toward the polycrystalline raw material by the quartz plate, and thereby total heat quantity applied to the polycrystalline raw material can be increased in comparison with a conventional method. Consequently, the time required for melting can be shortened, thereby production time of the single crystal can be shortened, and improvement in productivity and reduction in production cost can be therefore achieved.

Moreover, the quartz pipe and the quartz plate that are subjected to any of gold plating, gold evaporation and gold coating are preferably used as the reflecting structure of the quartz pipe and the quartz plate.

In this manner, when the quartz pipe and the quartz plate that are subjected to any of plating, evaporation and coating of gold, which has a good reflection rate of heat rays, are used, reflection efficiency of the heat rays from the crucible and the like can be enhanced and the melting time of the polycrystalline raw material can be further shortened.

Moreover, when the quartz plate that is subjected to any of the gold plating, the gold evaporation and the gold coating is used as the reflecting structure, the quartz plate is preferably used which has a sandwich structure where the gold plating, the gold evaporation and the gold coating are covered with quartz.

In this manner, when the quartz plate that has the sandwich structure where the gold plating, the gold evaporation and the gold coating are covered with quartz is used, a gold thin film can be prevented from being peeled and incorporation of impurities can be prevented during melting the polycrystalline raw material and producing the single crystal. In addition, the gold thin film can be also prevented from being peeled during cleaning the quartz plate.

Moreover, the quartz pipe having a halogen lamp that is arranged so as to form a condensing and reflecting structure for heating the polycrystalline raw material is preferably used.

In this manner, when the quartz pipe is used as an auxiliary to the heater, the quartz pipe in which the halogen lamp is arranged inside so as to form the condensing and reflecting structure for heating the polycrystalline raw material, the heat quantity applied to the polycrystalline raw material can be increased at the time of melting the polycrystalline raw material and thereby the time required for melting can be further shortened.

Moreover, the quartz pipe having a lens as the condensing structure of the halogen lamp can be used.

In this manner, when the quartz pipe having the lens is used, the polycrystalline raw material can be easily brought into focus of the heat rays emitted from the halogen lamp and thereby melting the polycrystalline raw material can be more advanced.

Moreover, the polycrystalline raw material can be melted with cooling the quartz pipe and/or the quartz plate by water and/or air when the polycrystalline raw material is heated and melted.

In this manner, when the cooling mechanisms of the quartz pipe and the quartz plate are provided, heat resistance of the quartz pipe and the quartz plate can be improved, thereby it can be used for a long time and cost of the quartz pipe and the quartz plate can be reduced.

Moreover, the quartz pipe that is capable of bringing the polycrystalline raw material into focus of heat rays by moving up and down may be further used.

When the quartz pipe is movable up and down, the quartz pipe can easily bring the polycrystalline raw material into focus of the heat rays to be reflected by the reflecting structure of the quartz pipe.

As described above, since the apparatus for producing a single crystal according to the present invention can usefully use the heat that is conventionally thrown away due to dissipation from the leading passage and the chamber, the melting time of the polycrystalline raw material can be shortened in comparison with a conventional apparatus, thereby reduction in production time of the single crystal can be achieved, and the improvement in the productivity and the reduction in the production cost can be consequently achieved.

BEST MODE FOR CARRYING OUT THE INVENTION

Hereinafter, the present invention will be explained in detail.

As mentioned above, it had been desired to develop the apparatus and the method for producing a single crystal that enable the improvement in the productivity and the reduction in the production cost to be achieved by shortening the melting time of the polycrystalline raw material and hence by shortening the cycle time.

In view of this, the present inventor paid attention to the heat dissipated from the leading passage for the single crystal and the chamber, and repeatedly keenly conducted studies of possibility of usefully using the heat.

As a result, the present inventor thought of advancing the melt by condensing the heat dissipated from the leading passage and the chamber to reflect toward the polycrystalline raw material contained in the crucible, and thereby bringing the present invention to completion.

Hereinafter, the present invention will be explained more in detail referring to the attached figures. However, the present invention is not restricted thereto.

Figure 1:
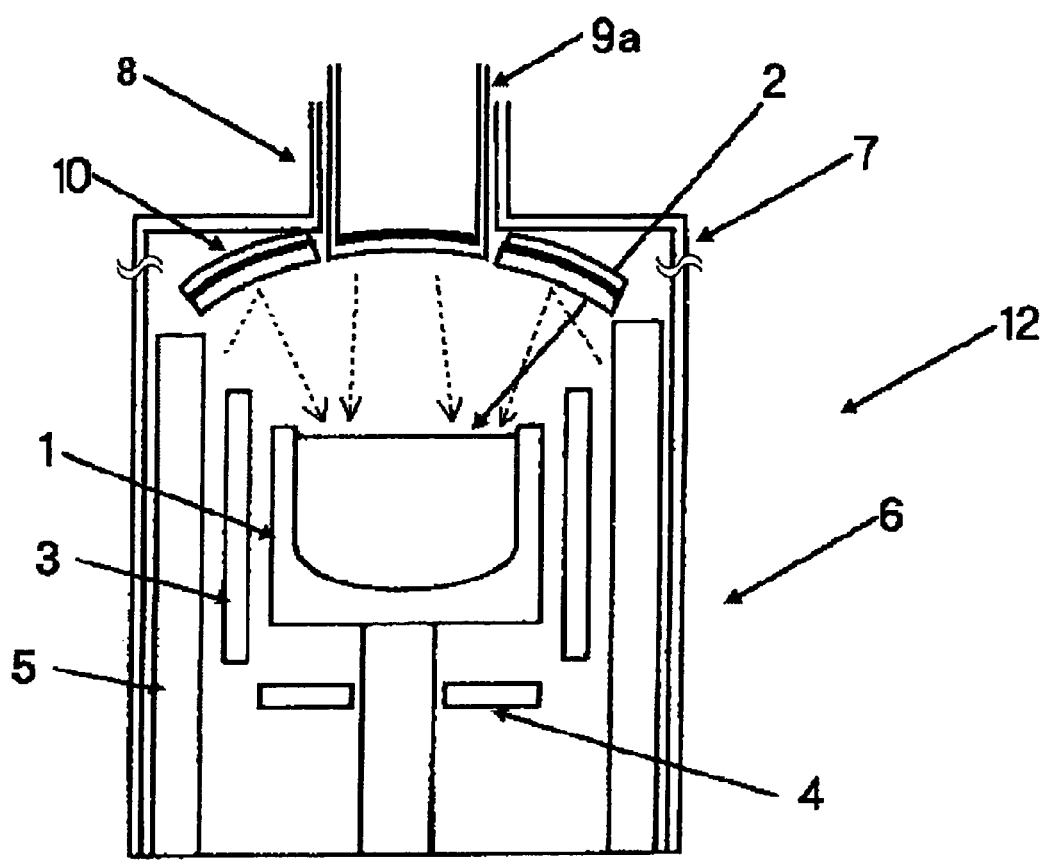
FIG. 1 is a schematic sectional view showing an example of the apparatus for producing a single crystal according to the present invention.

FIG. 1 is a schematic sectional view showing an example of the apparatus for producing a single crystal according to the present invention.

In the apparatus for producing a single crystal 12 shown in FIG. 1, 1 shows the crucible that accommodates the polycrystalline raw material 2 and a cylindrical heater 3 made of graphite etc. is arranged in the outer periphery of the crucible. As needed, a bottom portion heat insulating material 4 is arranged below the crucible 1, and a cylindrical heat insulating material 5 is arranged outside the heater 3. These are accommodated in a lower chamber 6 or an upper chamber 7. Moreover, the leading passage 8 for pulling the single crystal is provided in the upper chamber 7.

Here, in the present invention, the cylindrical quartz pipe 9a is arranged from the upper chamber 7 through the leading passage 8 and the dome-shaped quartz plate 10 is arranged so as to surround the quartz pipe 9a.

The cylindrical quartz pipe 9a has the curved-surface-shaped bottom portion and has the reflecting structure where the heat rays is reflected toward the polycrystalline raw material 2 in the crucible 1. The quartz plate 10 has the reflecting structure where the heat rays is reflected toward the polycrystalline raw material 2 in the crucible 1.

Here, quartz faces a hot zone to have a high temperature in the reflecting structure of the quartz pipe 9a and the quartz plate 10. An inside of a cylindrical pipe in the quartz pipe 9a and a side of the upper chamber 7 in the quartz plate 10 correspond the reflecting structure respectively. It is to be noted that a portion of the reflecting structure is preferably dual structure that is covered with quartz so as not to expose the reflecting structure to the inside of the chamber.

As described above, the apparatus is composed such that the cylindrical quartz pipe, which has the reflecting structure where at least the bottom portion reflects the heat rays and has the curved-surface-shaped bottom portion, is arranged above the crucible, and the dome-shaped quartz plate, which has the reflecting structure where the heat rays is reflected toward the crucible, is arranged around the quartz pipe, and then the polycrystalline raw material is melt.

This structure enables the heat rays dissipated toward the leading passage and the chamber from the heater to be condensed and to be reflected toward the polycrystalline raw material, and thereby the heat can be used usefully. Consequently, the heat quantity applied to the polycrystalline raw material can be increased in comparison with a conventional apparatus, the time required for melting can be shortened, and the improvement in the productivity and the reduction in the production cost can be therefore achieved.

Here, any of gold plating, gold evaporation and gold coating can be performed as the reflecting structure of the quartz pipe and the quartz plate.

In this manner, when any of gold plating, gold evaporation and gold coating are performed as the reflecting structure of the quartz pipe and the quartz plate, the reflection efficiency of the heat rays from the heater can be enhanced and therefore the melting time of the polycrystalline raw material can be further shortened. Specifically, the gold plating and the like can be performed at a bottom surface and/or a side surface of the inside of the quartz pipe. Moreover, the gold plating and the like can be performed at a surface of a chamber side of the quartz plate.

In the case of the gold plating, the reflection efficiency is 0.85, it is sufficiently higher than that of a graphite material and a quartz material and the time required for melting can be therefore shortened.

Moreover, when any of the gold plating, the gold evaporation and the gold coating are performed as the reflecting structure of the quartz plate, the quartz plate can have the sandwich structure where the gold plating, the gold evaporation and the gold coating are covered with quartz.

In this manner, when the quartz plate has the sandwich structure where the gold plating, the gold evaporation and the gold coating are covered with quartz, the gold thin film can be prevented from being peeled and incorporation of impurities can be prevented during melting the polycrystalline raw material and producing the single crystal. In addition, the gold thin film can be also prevented from being peeled during cleaning the quartz plate.

Moreover, the quartz pipe and/or the quartz plate can be provided with the water-cooled mechanism and/or the air-cooled mechanism for removing heat.

In this manner, when the cooling mechanisms of the quartz pipe and the quartz plate are provided, the heat resistance of the quartz pipe and the quartz plate can be improved, thereby even if the gold plating and the like are performed it can be used for a long time, and the cost of the quartz pipe and the quartz plate can be reduced.

The quartz pipe is preferably cooled with water and the quartz plate is preferably cooled with air. Argon gas introduced from the chamber is preferably used for cooling the quartz plate with air.

Furthermore, the quartz pipe that is movable up and down can be adopted.

In this manner, when the quartz pipe is movable up and down, the polycrystalline raw material can be easily brought into focus of the heat rays to be reflected by the reflecting structure of the quartz pipe.

Figure 2:
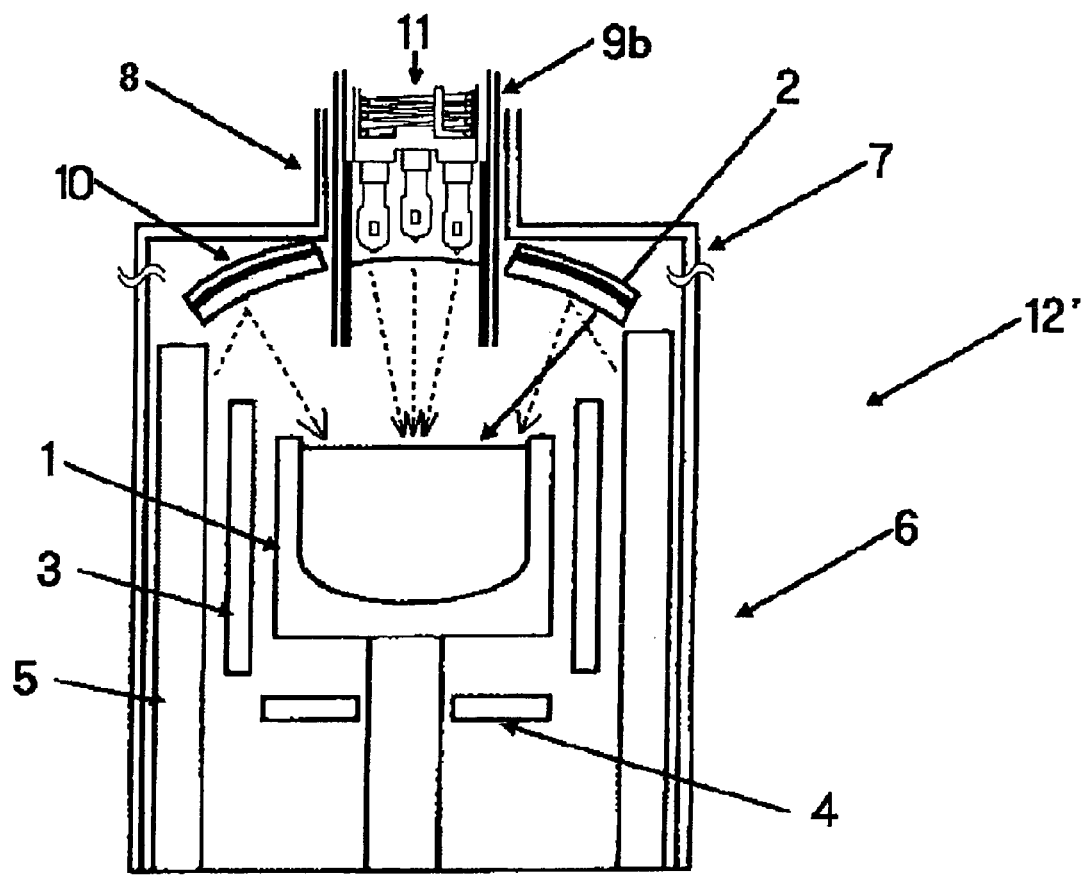
FIG. 2 is a schematic sectional view showing another example of the apparatus for producing a single crystal according to the present invention.

FIG. 2 shows a schematic sectional view of another example of the apparatus for producing a single crystal according to the present invention.

In the apparatus for producing a single crystal 12' shown in FIG. 2, 1 shows the crucible that accommodates the polycrystalline raw material 2 and the cylindrical heater 3 made of graphite etc. is arranged in the outer periphery of the crucible. As needed, the bottom portion heat insulating material 4 is arranged below the crucible 1, and a cylindrical heat insulating material 5 is arranged outside the heater 3. These are accommodated in the lower chamber 6 or the upper chamber 7. Moreover, the leading passage 8 for pulling the single crystal is provided in the upper chamber 7. This structure is the same as FIG. 1 as far as arrangement of the dome-shaped quartz plate 10.

Structure of the quartz pipe 9b is different from FIG. 1. That is, the cylindrical quartz pipe 9b has the halogen lamp 11, which is arranged so as to form the condensing and reflecting structure, inside.

In this manner, when the halogen lamp is arranged inside the quartz pipe as an auxiliary to the heater so as to form the condensing and reflecting structure for heating the polycrystalline raw material, the heat quantity applied to the polycrystalline raw material can be further increased, and thereby the time required for melting can be further shortened. In this case, the gold plating and the like are also preferably performed at the bottom surface of the inside of the quartz pipe 9b.

In the case of having the halogen lamp as described above, melting the polycrystalline raw material can be more advanced by also actively reflecting the heat rays dissipated from the crucible by the heat rays radiated from the halogen lamp.

Here, the quartz pipe having the lens as the condensing structure can be adopted.

In this manner, when the lens is provided, the quartz pipe can easily bring the polycrystalline raw material into focus of the heat rays emitted from the halogen lamp, and thereby melting the polycrystalline raw material can be more advanced.

In this case, it is more preferable that the gold plating and the like are also performed at the side surface of the quartz pipe.

Next, the method for producing a single crystal according to the present invention will be explained referring to FIG. 1. However, the present invention is not of course restricted thereto.

First, a lump of the polycrystalline raw material 2 is introduced into the crucible 1 in the chamber of the apparatus for producing a single crystal 12.

Then, the polycrystalline raw material 2 is heated and melted with the heater 3.

In this case, the cylindrical quartz pipe 9a is arranged from the upper chamber 7 through the leading passage 8 so that at least the bottom portion faces the upper portion of the crucible 1, the cylindrical quartz pipe which has the reflecting structure where the bottom portion reflects the heat rays and has the curved-surface-shaped bottom portion.

At the same time, the dome-shaped quartz plate 10 is arranged so as to surround the cylindrical quartz pipe 9a, the dome-shaped quartz plate which has the reflecting structure where the heat rays are reflected toward the crucible 1.

In this manner, the cylindrical quartz pipe 9a, which has the reflecting structure where the heat rays is reflected toward the crucible and has the curved-surface-shaped bottom portion, is arranged through the leading passage so that the bottom portion faces the upper portion of the crucible, and at the same time, the dome-shaped quartz plate, which has the reflecting structure where the heat rays are reflected toward the crucible, is arranged around the quartz pipe, the polycrystalline raw material is melted. According to this method, the heat rays dissipated toward the leading passage from the heater and the crucible can be condensed by the quartz pipe, the heat rays dissipated toward the chamber can be condensed by the quartz plate, and both condensed heat rays can be reflected toward the polycrystalline raw material. The heat quantity applied to the polycrystalline raw material can be therefore increased in comparison with the conventional method and consequently, the time required for melting can be shortened.

After melting the polycrystalline raw material 2, the cylindrical quartz pipe 9a is pulled up from the leading passage 8 and taken out outside the chamber.

Then, the seed crystal (not shown) is brought into contact with the polycrystalline raw material melt and the single crystal is produced by pulling the seed crystal at a predetermined speed.

In this case, the single crystal is desirably produced in condition where the quartz plate 10 remains in the chamber. The heat rays dissipated toward the chamber is condensed and reflected by the quartz plate 10 remaining in the chamber even during producing the single crystal as described above, thereby the heat quantity dissipated from the heater or the melt can be reduced, and heater power can be consequently suppressed during growing the crystal. The electric power cost can be therefore more improved.

The quartz plate 10 is desirably taken out outside the chamber to clean after the end of producing the single crystal.

Since cleaning the quartz plate after the end of producing the single crystal enables the quartz plate to be kept pure, the incorporation of impurities into the melt can be suppressed and the reflection efficiency of heat can be kept high.

Here, the polycrystalline raw material can be melted by using the quartz pipe and the quartz plate that are subjected to any of gold plating, gold evaporation and gold coating as the reflecting structure of the quartz pipe and the quartz plate.

In this manner, when the quartz pipe and the quartz plate that are subjected to any of plating, evaporation and coating of gold are used as the reflecting structure of the quartz pipe and the quartz plate, the reflection efficiency of the heat rays from the heater can be enhanced and the melting time of the polycrystalline raw material can be further shortened.

When the quartz plate that is subjected to any of the gold plating, the gold evaporation and the gold coating is used as the reflecting structure, the quartz plate is preferably used which has the sandwich structure where the gold plating, the gold evaporation and the gold coating are covered with quartz.

In this manner, when the quartz plate that has the sandwich structure where the gold plating, the gold evaporation and the gold coating are covered with quartz is used, the gold thin film can be prevented from being peeled and the incorporation of impurities can be prevented during melting the polycrystalline raw material and producing the single crystal. In addition, the gold thin film can be also prevented from being peeled during cleaning the quartz plate.

Moreover, the quartz pipe having the halogen lamp that is arranged inside so as to form the condensing and reflecting structure for heating the polycrystalline raw material is preferably used.

In this manner, when the quartz pipe is used in which the halogen lamp is arranged inside so as to form the condensing and reflecting structure for heating the polycrystalline raw material, the heat quantity applied to the polycrystalline raw material can be increased at the time of melting the polycrystalline raw material and thereby the time required for melting can be further shortened.

Moreover, the quartz pipe having the lens as the condensing structure of the halogen lamp can be used.

In this manner, when the quartz pipe having the lens is used, the polycrystalline raw material can be easily brought into focus of the heat rays emitted from the halogen lamp and thereby melting the polycrystalline raw material can be more advanced.

Furthermore, the polycrystalline raw material can be melted with cooling the quartz pipe and/or the quartz plate by water and/or air for removing heat.

In this manner, when the cooling mechanisms of the quartz pipe and the quartz plate are provided, the heat resistance of the quartz pipe and the quartz plate can be improved. Hence, it can be used for a long time and the cost of the quartz pipe and the quartz plate can be reduced.

Here, the quartz pipe is preferably cooled with water and the quartz plate is preferably cooled with air. Argon gas introduced from the chamber is preferably used for cooling the quartz plate with air.

Moreover, the quartz pipe that is movable up and down can be used.

When the quartz pipe is movable up and down, the quartz pipe can easily bring the polycrystalline raw material into focus of the heat rays to be reflected by the reflecting structure of the quartz pipe.

As explained above, according to the apparatus and the method for producing a single crystal of the present invention, the heat rays dissipated toward the leading passage from the heater and the crucible can be condensed to reflect toward the polycrystalline raw material by the cylindrical quartz pipe, and the heat rays dissipated toward the chamber can be condensed to reflect toward the polycrystalline raw material by the quartz plate. The heat that is conventionally thrown away can be thereby used usefully. Melting can be therefore advanced by increasing total heat quantity applied to the polycrystalline raw material in comparison with a conventional apparatus and method, and the time required for melting can be shortened. Consequently, the time required for producing the single crystal can be shortened, and the improvement in the productivity and the reduction in the production cost can be therefore achieved. In particular, since the present invention can melt the raw material in a short time without an increase in electric power, deterioration of the crucible such as a quartz crucible can be suppressed. As a result, there are also subsidiary effects that an occurrence of slip dislocations of the single crystal due to the crucible can be suppressed and a ratio of obtaining the single crystal improves.

Hereinafter, the present invention will be explained in more detail based on examples and Comparative Example, but the present invention is not restricted thereto.

Example 1

A silicon single crystal was produced by using the apparatus for producing a single crystal shown in FIG. 1. The crucible having a diameter of 32 inches (80 cm) was used and a polycrystalline silicon raw material of 300 kg was charged into the crucible. Power applied from the heater to the polycrystalline raw material and the crucible was set to be 200 kW.

The quartz pipe that was subjected to gold plating at its bottom portion and its side surface was arranged through the leading passage so as to face the crucible. The quartz plate that was subjected to gold plating to reflect the heat rays toward the crucible was arranged so as to surround the quartz pipe. Then, the polycrystalline silicon was melted.

At that time, the time required for melting the polycrystalline raw material was measured. As a result, melting the polycrystalline silicon was finished in 13 hours.

Comparative Example 1

Figure 4:
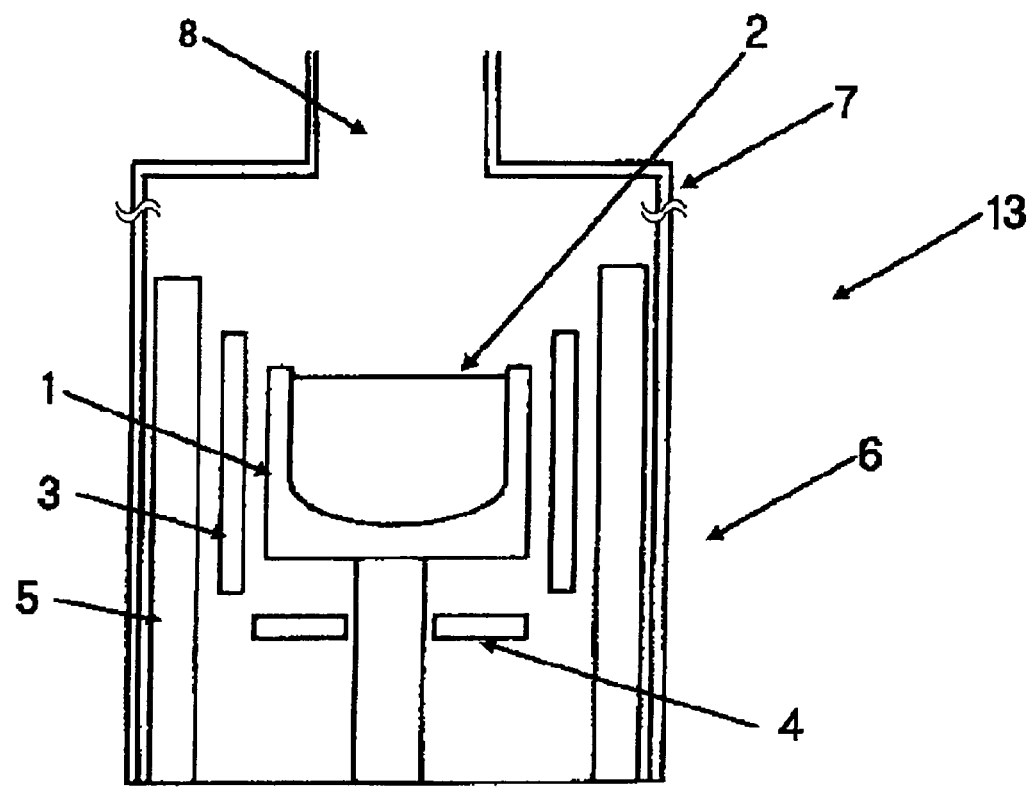
FIG. 4 is a schematic sectional view showing an example of a conventional apparatus for producing a single crystal.

A silicon single crystal was produced as with Example 1 by using the apparatus for producing a single crystal shown in FIG. 4 without arrangement of the quartz pipe and the quartz plate in the chamber. The time required for melting the polycrystalline silicon was measured as with Example 1.

The polycrystalline silicon was melted without the arrangement of the quartz pipe and the quartz plate and without condensing and reflecting the heat rays dissipated toward the leading passage and the chamber. As a result, the melting time was 15 hours and thus, a longer time was required for melting than Example 1 in which the heat rays was condensed and reflected.

Example 2

Figure 3:
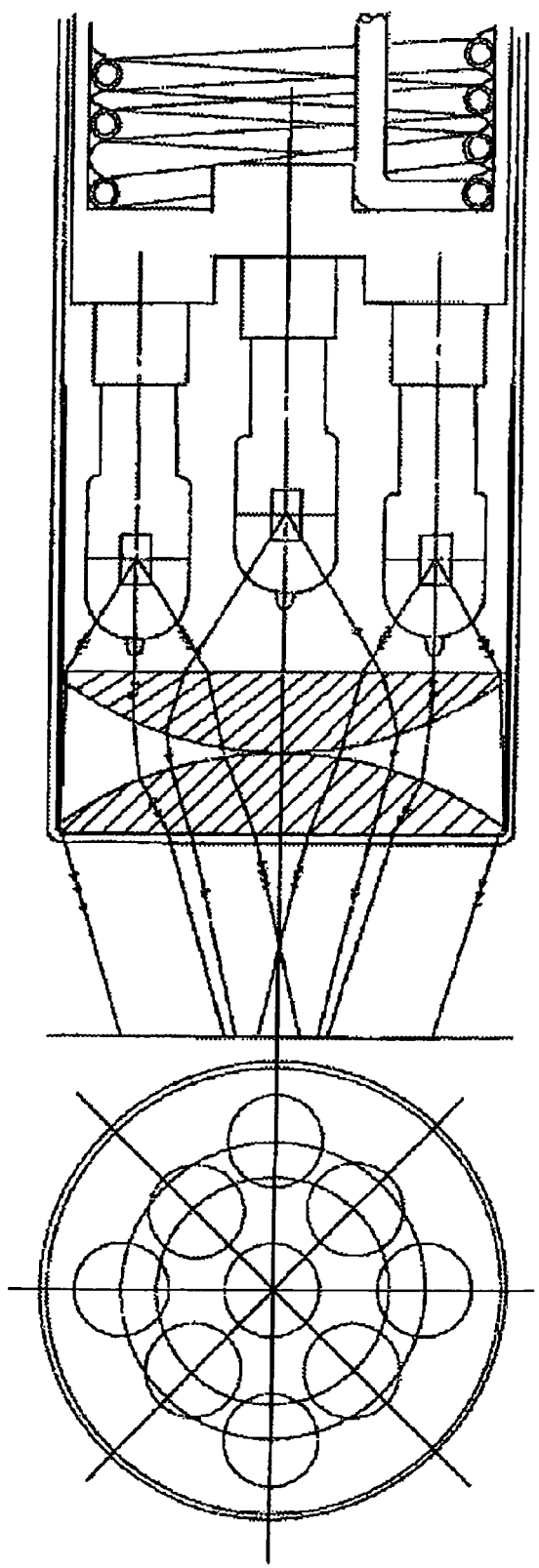
FIG. 3 is a schematic view showing the halogen lamp provided in the cylindrical quartz pipe used in Example 2.

The polycrystalline silicon was melted as with Example 1 and the time required for melting was measured as with Example 1 using the quartz pipe 9b of the apparatus for producing a single crystal 12' as shown in FIG. 2, the quartz pipe which had the halogen lamp shown in FIG. 3.

Nine halogen lamps of 5 kW, this is 45 kW in total, were arranged in the quartz pipe, and the quartz pipe had structure of condensing by a quartz lens. It was calculated that heat efficiency including heat except a condensing rate was 58% and among them, 20 kW contributed for melting.

In Example 2, the time required for melting the polycrystalline silicon was 10 hours through existence of an auxiliary heating by the halogen lamps.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. An apparatus for producing a single crystal having at least: a chamber; a crucible in the chamber; a heater arranged around the crucible; a pulling mechanism for pulling a seed crystal; and a leading passage for the seed crystal and the single crystal to be grown; and producing the single crystal by melting a polycrystalline raw material contained in the crucible by the heater, bringing the seed crystal into contact with the polycrystalline melt and pulling the seed crystal, wherein the apparatus includes a cylindrical quartz pipe having a curved-surface-shaped bottom portion and a dome-shaped quartz plate, the curved-surface-shaped bottom portion being a closed bottom surface, the quartz pipe being configured to increase heat quantity applied to the polycrystalline raw material by reflecting heat rays during melting the polycrystalline raw material, the quartz pipe being arranged from an upper portion of the chamber through the leading passage so that the curved-surface-shaped bottom portion faces an upper portion of the crucible, and the quartz plate is arranged so as to surround the quartz pipe, the quartz pipe has a reflecting structure where at least the bottom portion reflects heat rays, and the quartz plate has a reflecting structure where heat rays are reflected toward the crucible, the reflecting structures of the quartz pipe and quartz plate are produced by any of gold plating, gold evaporation and gold coating, and the quartz plate has a sandwich structure where the reflecting structure of the quartz plate is covered with quartz.

2. An apparatus for producing a single crystal having at least: a chamber; a crucible in the chamber; a heater arranged around the crucible; a pulling mechanism for pulling a seed crystal; and a leading passage for the seed crystal and the single crystal to be grown; and producing the single crystal by melting a polycrystalline raw material contained in the crucible by the heater, bringing the seed crystal into contact with the polycrystalline melt and pulling the seed crystal, wherein the apparatus includes a cylindrical quartz pipe having a curved-surface-shaped bottom portion and a dome-shaped quartz plate, the curved-surface-shaped bottom portion being a closed bottom surface, the quartz pipe being configured to increase heat quantity applied to the polycrystalline raw material by reflecting heat rays during melting the polycrystalline raw material, the quartz pipe being arranged from an upper portion of the chamber through the leading passage so that the curved-surface-shaped bottom portion faces an upper portion of the crucible, and the quartz plate is arranged so as to surround the quartz pipe, the quartz pipe has a reflecting structure where at least the bottom portion reflects heat rays, and the quartz plate has a reflecting structure where heat rays are reflected toward the crucible, and the quartz pipe has a halogen lamp inside, and the halogen lamp is arranged so as to form a condensing and reflecting structure for heating the polycrystalline raw material.

3. The apparatus for producing a single crystal according to claim 2, wherein the reflecting structures of the quartz pipe and quartz plate are produced by any of evaporation and gold coating.

4. The apparatus for producing a single crystal according to claim 3, wherein the quartz plate has a sandwich structure where the reflecting structure of the quartz plate is covered with quartz.

5. The apparatus for producing a single crystal according to claim 4, wherein the quartz pipe has a lens as the condensing and reflecting structure of the halogen lamp.

6. The apparatus for producing a single crystal according to claim 5, wherein the quartz pipe and/or the quartz plate have a water-cooled mechanism and/or an air-cooled mechanism for removing heat.

7. The apparatus for producing a single crystal according to claim 6, wherein the quartz pipe is movable up and down.

8. The apparatus for producing a single crystal according to claim 3, wherein the quartz pipe has a lens as the condensing and reflecting structure of the halogen lamp.

9. The apparatus for producing a single crystal according to claim 2, wherein the quartz pipe has a lens as the condensing and reflecting structure of the halogen lamp.

10. The apparatus for producing a single crystal according to claim 2, wherein the quartz pipe and/or the quartz plate have a water-cooled mechanism and/or an air-cooled mechanism for removing heat.

11. The apparatus for producing a single crystal according to claim 2, wherein the quartz pipe is movable up and down.

12. A method for producing a single crystal according to a Czochralski method comprising melting a polycrystalline raw material contained in a crucible by heating with a heater, and growing the single crystal by pulling a seed crystal after bringing the seed crystal into contact with the melt, wherein at the time of melting the polycrystalline raw material by heating, arranging a cylindrical quartz pipe from an upper portion of a chamber through a leading passage so that a bottom portion of the quartz pipe faces an upper portion of the crucible, the cylindrical quartz pipe increasing heat quantity applied to the polycrystalline raw material by reflecting heat rays during melting the polycrystalline raw material, having a reflecting structure where at least the bottom portion reflects heat rays and having a curved-surface-shaped bottom portion, the curved-surface-shaped bottom portion being a closed bottom surface, and arranging a dome-shaped quartz plate so as to surround the quartz pipe, the dome-shaped quartz plate having a reflecting structure where heat rays are reflected toward the crucible, the reflecting structures of the quartz pipe and the quartz plate being produced by any of gold plating, gold evaporation and gold coating, the quartz plate having a sandwich structure where the reflecting structure of the quartz plate is covered with quartz, heating and melting the polycrystalline raw material, taking out the quartz pipe outside the chamber after melting, and bringing the seed crystal into contact with the polycrystalline raw material melt subsequently and pulling the single crystal to produce the single crystal.

13. A method for producing a single crystal according to a Czochralski method comprising melting a polycrystalline raw material contained in a crucible by heating with a heater, and growing the single crystal by pulling a seed crystal after bringing the seed crystal into contact with the melt, wherein at the time of melting the polycrystalline raw material by heating, arranging a cylindrical quartz pipe from an upper portion of a chamber through a leading passage so that a bottom portion of the quartz pipe faces an upper portion of the crucible, the cylindrical quartz pipe increasing heat quantity applied to the polycrystalline raw material by reflecting heat rays during melting the polycrystalline raw material, having a reflecting structure where at least the bottom portion reflects heat rays and having a curved-surface-shaped bottom portion, the curved-surface-shaped bottom portion being a closed bottom surface, and arranging a dome-shaped quartz plate so as to surround the quartz pipe, the dome-shaped quartz plate having a reflecting structure where heat rays are reflected toward the crucible, the quartz pipe having a halogen lamp that is arranged so as to form a condensing and reflecting structure for heating the polycrystalline raw material, heating and melting the polycrystalline raw material, taking out the quartz pipe outside the chamber after melting, and bringing the seed crystal into contact with the polycrystalline raw material melt subsequently and pulling the single crystal to produce the single crystal.

14. The method for producing a single crystal according to claim 13, wherein the reflecting structures of the quartz pipe and the quartz plate are produced by any of gold plating, gold evaporation and gold coating.

15. The method for producing a single crystal according to claim 14, wherein the quartz plate has a sandwich structure where the reflecting structure of the quartz plate is covered with quartz.

16. The method for producing a single crystal according to claim 15, wherein the quartz pipe has a lens as the condensing structure of the halogen lamp.

17. The method for producing a single crystal according to claim 16, wherein the step of melting the polycrystalline raw material comprises cooling the quartz pipe and/or the quartz plate by water and/or air.

18. The method for producing a single crystal according to claim 17, wherein the quartz pipe is capable of bringing the polycrystalline raw material into focus of heat rays by moving up and down.

19. The method for producing a single crystal according to claim 14, wherein the quartz pipe has a lens as the condensing structure of the halogen lamp.

20. The method for producing a single crystal according to claim 13, wherein the quartz pipe has a lens as the condensing structure of the halogen lamp.

21. The method for producing a single crystal according to claim 13, wherein the step of melting the polycrystalline raw material comprises cooling the quartz pipe and/or the quartz plate by water and/or air.

22. The method for producing a single crystal according to claim 13, wherein the quartz pipe is capable of bringing the polycrystalline raw material into focus of heat rays by moving up and down.

* * * * *